(12) United States Patent
Alliata et al.

(10) Patent No.: US 11,942,379 B1
(45) Date of Patent: Mar. 26, 2024

(54) INSPECTION METHOD FOR DETECTING A DEFECTIVE BONDING INTERFACE IN A SAMPLE SUBSTRATE, AND MEASUREMENT SYSTEM IMPLEMENTING THE METHOD

(71) Applicant: Unity Semiconductor, Montbonnot-Saint-Martin (FR)

(72) Inventors: Dario Alliata, Montbonnot-Saint-Martin (FR); Jean-François Boulanger, Montbonnot-Saint-Martin (FR)

(73) Assignee: Unity Semiconductor, Montbonnot-Saint-Martin (FR)

( * ) Notice: Subject to any disclaimer, the term of this patent is extended or adjusted under 35 U.S.C. 154(b) by 0 days.

(21) Appl. No.: 18/359,661

(22) Filed: Jul. 26, 2023

(30) Foreign Application Priority Data

Dec. 8, 2022 (EP) ..................................... 22315316

(51) Int. Cl.
*H01L 21/66* (2006.01)
*G01N 21/95* (2006.01)

(52) U.S. Cl.
CPC ......... *H01L 22/12* (2013.01); *G01N 21/9501* (2013.01); *H01L 22/20* (2013.01)

(58) Field of Classification Search
CPC .................. G01N 21/9501; G01N 21/9505; H01L 22/12; H01L 22/20
See application file for complete search history.

(56) References Cited

U.S. PATENT DOCUMENTS

| | | | |
|---|---|---|---|
| 7,812,942 B2 | 10/2010 | Moulin et al. | |
| 2008/0317334 A1 | 12/2008 | Hausler | |
| 2009/0051930 A1 | 2/2009 | Moulin et al. | |
| 2013/0188179 A1 | 7/2013 | Tang | |
| 2014/0285797 A1 | 9/2014 | Gastaldo et al. | |
| 2018/0059032 A1* | 3/2018 | Perrot ................ | G01N 21/8422 |

FOREIGN PATENT DOCUMENTS

CN 111128792 A * 5/2020 ......... G01N 21/8422

OTHER PUBLICATIONS

European Extended Search Report and Opinion for European Application No. 22315316.4, dated Apr. 28, 2023, 6 pages.

* cited by examiner

*Primary Examiner* — Michael A Lyons
(74) *Attorney, Agent, or Firm* — TraskBritt (57) ABSTRACT

A measurement system and an inspection method for detecting a defective bonding interface in a sample substrate including at least one element disposed on a support. The method comprises: placing the sample substrate in the measurement system, establishing an inclination map of the exposed surface, analyzing the inclination map and identifying a zone or zones of the exposed surface whose inclinations deviate by more than a given threshold from the inclination of the reference surface; and detecting the presence of a defective bond between the element and the support, depending on the result of the analysis of the inclination map.

16 Claims, 4 Drawing Sheets

INSPECTION METHOD FOR DETECTING A DEFECTIVE BONDING INTERFACE IN A SAMPLE SUBSTRATE, AND MEASUREMENT SYSTEM IMPLEMENTING THE METHOD

PRIORITY CLAIM

This application claims the benefit of the filing date of European Patent Application Serial No. EP22315316.4, filed Dec. 8, 2022, for "Inspection Method for Detecting a Defective Bonding Interface in a Sample Substrate, and Measurement System Implementing the Method," the disclosure of which is hereby incorporated herein in its entirety by this reference.

TECHNICAL FIELD

The present disclosure relates to a method for inspecting a sample substrate and for indicating the presence of a defective bonding interface in the sample substrate. Such bonding interface may exist between at least an element (a film, a functional device) and a support, the element and the support forming the sample substrate. A defective bonding may correspond to a weak bonding between the element and the support or to a partial delamination between the element and the support. In the context of the present disclosure, "bonding" refers to any stacking technique known in the semiconductor industry, where two elements (e.g., substrates) are assembled together, such as direct bonding, thermocompression bonding, or interconnection bonding between bumps and vias. The present disclosure finds a particular application in the field of wafer level testing of semiconductor substrates, such as a silicon on insulator substrate, or an advanced integrated circuit, such as High Bandwidth memory, Systems on Chips, integrated photonic components, etc.

BACKGROUND

Bonding techniques have found numerous applications in the integrated circuit (IC) industry. For instance, 3D IC packaging techniques such as Wafer Level Packaging (WLP) provide high density packaged IC components, essentially of the same size as the chip, or die, itself. According to these techniques, the chips or the dies may be piled up and bonded to each other according to a thermal compression process that consists of heating and applying thermal and mechanical pressure to two joining bodies. The diffusion of the metals results in the metallurgical bond between the two surfaces. As an alternative approach, the bonding can be achieved by a hybrid bonding process involving molecular adhesion of dielectric layers and thermal fusion of metal interconnections. Such techniques are used, for instance, in the manufacturing of High Bandwidth Memories (HBM). Hybrid bonding can be used for die-on-die, die-on-wafer and wafer-on-wafer bonding.

According to other integration techniques, chips or dies are integrated in a mold compound and connected via a redistribution layer (RDL) to solder bumps, as systems on Chip (SoC). These assemblies can then be stacked in several layers by thermocompression of the solder bumps.

Other integration techniques also exist, for instance, to create large size wafers of photonic components, by bonding tiles of III-V materials initially grown by epitaxy on a silicon wafer. This allows the use of such substrates on a larger scale in manufacturing processes.

In all the hereinabove listed cases, the quality of the bonding is essential to ensure the proper operation and the reliability of the components. Some defects can be found by electrical tests, in case of bad bonding between two elements interconnected vertically to allow the flow of the current. However, these electrical tests do not always allow detection of weak bonding or delamination, where electrical connections are established, or where the mechanical adhesion is poor. These defective bonding conditions can lead to subsequent failures of the components in operation, so it is important to detect them before the device is integrated into the final package and released for use.

As the bonding interface is buried between the die or film and the support, it cannot be easily and directly inspected. Existing inspection methods provide limited results or lack sensitivity. Such methods may, for instance, involve the inspection of the surface by bright field and dark field imaging, or optical and mechanical profilometry to retrieve the local height of the surface. However, poor bonding results in very small height variations, which are difficult to detect. In the case of bright field imaging, the optical contrast variation at the region affected by the defective bonding is not strong enough to allow reliable detection. In the case of dark field imaging, the tilt induced by the delamination does not scatter sufficient light for detection. The limited field of view of the optical profilometer and the typical mean time required to move the mechanical profilometer and perform measurements strongly penalize the efficiency of the inspection process across the entire wafer, and, consequently, the cost of the inspection per unit dramatically increases.

BRIEF SUMMARY

A purpose of the present disclosure is to resolve, at least partially, the aforementioned problem. More precisely, a purpose of the disclosure is to propose a method for indicating the presence of a defective bond between an element and a support of a sample substrate. The defective bond may correspond to a delamination, partial delamination, a poor or weak bonding between the element and the support. Another purpose of the disclosure is to propose an inspection method for indicating the presence of a defective bond allowing high throughput and full sample substrate inspection for applications in a high-volume manufacturing environment.

To this effect, the present disclosure relates to an inspection method for detecting a defective bonding interface in a sample substrate comprising at least one element disposed on a support, the bonding interface being defined between the at least one element and a main face of the support, an outer surface of the at least one element being exposed on a front side of the sample substrate and defining, at least in part, an exposed surface of the sample substrate.

According to the present disclosure, the method comprises:
- a providing step of placing the sample substrate in a measurement system;
- a measuring step of establishing, with the measurement system, an inclination map of the exposed surface, the inclination map being made of a plurality of local inclination measurements relative to a reference surface;
- an analyzing step of the inclination map, the analyzing step identifying a zone or zones of the exposed surface, referred to as "identified zone(s)," whose inclinations deviate by more than a given threshold from the inclination of the reference surface; and a decision step of detecting the presence of a defective bond between the element and the support, depending on the result of the analyzing step.

According to further non limiting features of this aspect of the present disclosure, either taken alone or in any technically feasible combination:

the reference surface corresponds to the main face of the support;

the inspection method further comprises, before the measuring step, a calibration step of the measurement system (MS), the calibration step defining an inclination map of the main face of the support;

the measurement system comprises a holder to receive the sample substrate during the measuring step, and the calibration step comprises a first sub step of establishing an inclination map of the holder, and a second sub step of defining the reference surface as the inclination map of the holder;

the measurement system comprises a holder to receive the sample substrate during the measuring step, and the calibration step comprises a first sub step of placing a dummy substrate on the holder, a second sub step of establishing an inclination map of an exposed surface of the dummy substrate, and a third sub step of defining the reference surface as the inclination map of the exposed surface of the dummy substrate;

the inspection method further comprises, after the measuring step, an offset step of applying an offset map to the inclination map, the transformation offsetting the local inclination measurements of the inclination map to be relative to the main face of the support;

wherein the offset step comprises a sub step of calculating a representative value of the local inclination measurements of the inclination map established by the measuring step;

the representative value is selected in the group formed of: a mean value, a median value, a mode value.

the offset step comprises:
   a first sub step of identifying, in the inclination map, local inclination measurements associated with the main surface of the support;
   a second sub step of defining the offset map from the identified local inclination measurements;

the second sub step comprises interpolating the identified local inclination measurements to define each entry of the offset map;

the analyzing step comprises:
   a first sub step of providing a localization map, the localization map defining the position of a plurality of predefined zones of the exposed surface of the sample substrate;
   a second sub step of calculating a representative value of the local inclination measurements associated with the plurality of predefined zones;

the representative value of the local inclination measurements associated with the predefined zones is selected in the group formed of: a mean value, a median value, a mode value;

the localization map comprises at least one predefined zone corresponding to the outer surface of the at least one element;

the first sub step of providing a localization map comprises providing an image of the exposed surface (1a) of the sample substrate and applying a numerical processing to the image to identify the outer surface of the at least one element.

According to another aspect, the present disclosure relates to a measurement system for detecting a defective bonding interface in a sample substrate comprising at least one element disposed on a support, the bonding interface being defined between the at least one element and a main face of the support, an outer surface of the at least one element being exposed on a front side of the sample substrate and defining, at least in part, an exposed surface of the sample substrate.

According to the present disclosure, the measurement system comprises a holder for receiving the sample substrate and a processing unit configured for performing an inspection method comprising:

a measuring step of establishing an inclination map of the exposed surface, the inclination map being made of a plurality of local inclination measurements relative to a reference surface;

an analyzing step of the inclination map, the analyzing step identifying a zone or zones of the exposed surface, referred to as "identified zone(s)," whose inclinations deviate by more than a given threshold from the inclination of the reference surface; and a decision step of detecting the presence of a defective bond between the element and the support, depending on the result of the analyzing step.

According to further non limiting features of this aspect of the present disclosure, either taken alone or in any technically feasible combination:

the measurement system further comprises:
   an illumination device to provide two coherent light beams directed to the exposed surface of the sample substrate, the two light beams illuminating the exposed surface of the sample substrate in shifted areas;
   a detector to collect the light of the two beams reflected by the exposed surface, the reflected light producing an interference signal on the detector;
   the processing unit being further configured to analyze the interference signal and produce at least one local inclination measurement of the inclination map;

the measurement system further comprises:
   a display screen configured to display a measurement pattern, such as a grid or stripes;
   a camera disposed in the system with respect to the display screen and to the sample substrate to image the patterns displayed by the display screen and reflected by the exposed surface of the sample substrate;
   the processing unit being further configured to analyze the image produced by the camera and produce the inclination map or at least a local inclination measure of the inclination map;

the measurement system further comprises a scanning unit to scan the exposed surface of the sample substrate so as to produce the inclination map.

BRIEF DESCRIPTION OF THE DRAWINGS

Many other features and advantages of the present disclosure will become apparent from reading the following detailed description, when considered in conjunction with the accompanying drawings, in which.

DETAILED DESCRIPTION

Generally, and as this has been presented in the preceding background section, a sample substrate 1 that is the subject of the detection method of the present description comprises a support 2 and at least one element 3 disposed on the support 2. The face of the support 2 on which the element 3 is disposed defines the front side of the sample substrate 1. The element 3 may correspond to a thin film, or a thin substrate, potentially with integrated circuit elements on it, extending over a major part of the support 2. Alternatively, the element 3 may correspond to a block of material, a die or a tile, potentially with integrated circuit elements on it. A plurality of such elements 3 may be disposed on the support 2 to pave it. In some embodiments, the element 3 and the support 2 comprise connection lines, pads, or bumps, to be electrically connected together. In all cases, the exposed surface 1a of the sample substrate 1, on its front side, comprises at least in part the outer surface 3a of the element 3.

As this is conventional in the semiconductor industry, the support 2 can be in the form of a wafer, or a disk whose diameter can be 100, 150, 200, 300 or even 450 mm and typically has a thickness of several hundred microns. The support may be made of, or comprise, a semiconductor material or substrate, such as silicon or silicon carbide, or an insulating material, such as glass or sapphire. The present disclosure, however, is not limited to a support having a particular shape, dimension, or nature.

The support presents a main face 2a onto which the at least one element 3 is disposed, and a back face 2b opposing the main face. An outer surface 3a of the at least one element 3 is, therefore, exposed on a front side of the sample substrate 1.

Figure 1A:
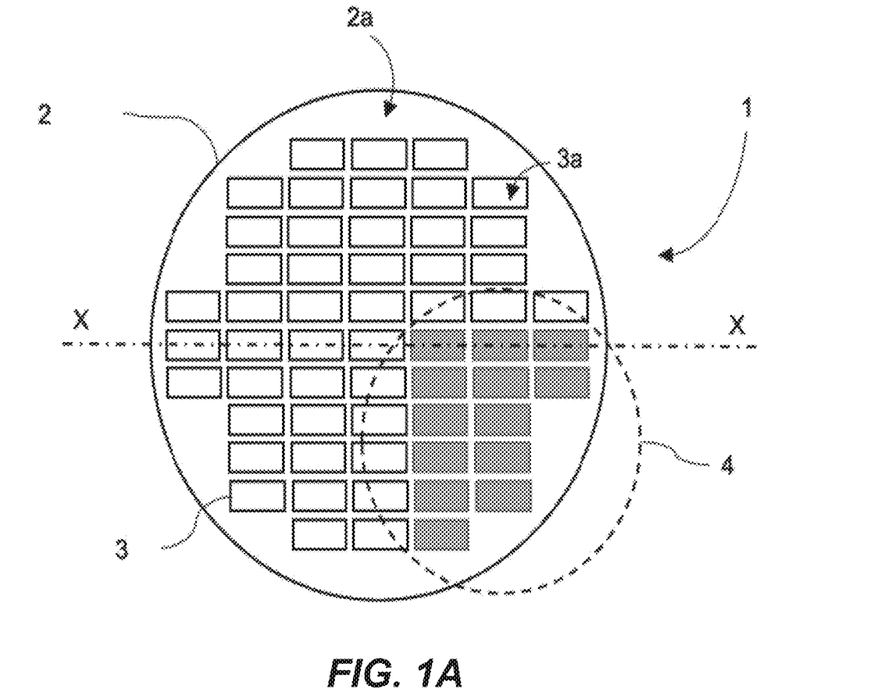
FIGS. 1A and 1B represent different views of a first exemplary sample substrate that may be subject to the inspection method according to the present disclosure.
Figure 1B:
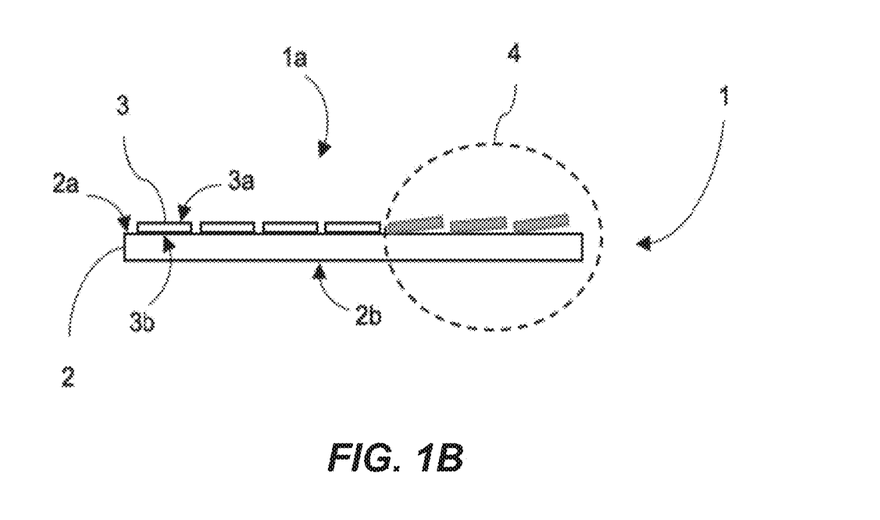

FIG. 1A represents, in top view, an example of such a sample substrate 1 and FIG. 1B represents this exemplary sample substrate 1 in a cross section along the X-X axis of FIG. 1A. In the example represented on these figures, the sample substrate 1 comprises a plurality of elements 3 paving the main surface 2a of the support. Each element 3 is constituted of a block of material that may have been processed to constitute functional semiconductor die or that may not have been processed to form simple tiles of material.

In the exemplary sample substrate 1 of FIGS. 1A and 1B, the plurality of elements 3 does not entirely cover the main face 2a of the support 2. Consequently, a surface of the main face 2a of the support 2, between two juxtaposed elements 3, is exposed. The exposed surface 1a of the sample substrate 1, on its front side, is formed of the outer surfaces 3a of the elements 3 and of the exposed surface of the main face 2a of the support 2.

Figure 2A:
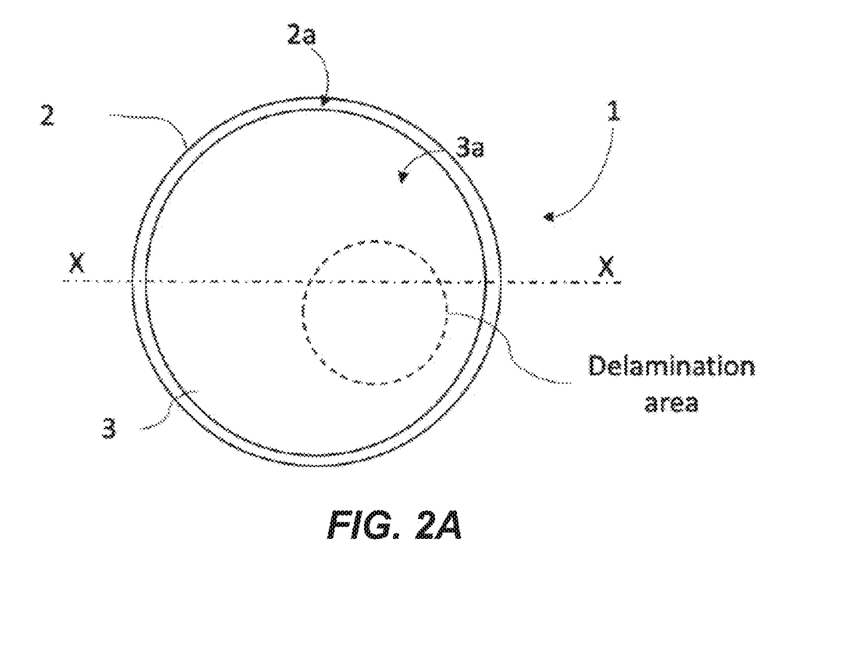
FIGS. 2A and 2B represent different views of a second exemplary sample substrate that may be subject to the inspection method according to the present disclosure.
Figure 2B:
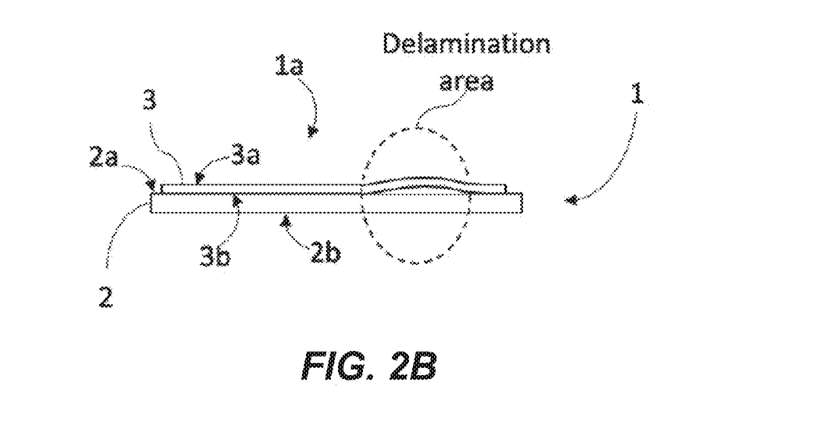

FIGS. 2A and 2B represent, in top view and cross-sectional view, another example of a sample substrate 1. In this second example, the sample substrate 1 comprises a thin substrate 3 disposed on the main face 2a of the support 2. The thin substrate 3 is extending over the main surface 2a of the support 2, to cover it completely or almost completely.

In the representation of FIGS. 2A and 2B, an annular and peripheral portion of the main face 2a of the support is exposed on the front side 1a of the sample substrate 1, but this is not necessarily the case. The thin substrate 3 may be formed of a layer of material or of a stack of layers. The thin substrate 3 may have been processed or not. In this example, the exposed surface 1a of the sample substrate 1, on its front side, is essentially formed of the outer surfaces 3a of the thin substrate 3.

Whatever the nature of the elements 3 (dies, tiles, a thin film or a thin substrate), they have been assembled to the main face 2a of the support 2 by a bonding technique, such as direct bonding, thermocompression bonding, or interconnection bonding between bumps and vias. A bonding interface 3b is, therefore, defined between the elements 3 and the main face 2a of the support 2.

The inspection method of the present description aims at detecting a defective bonding at this interface 3b. A defective bonding may correspond to a weak bonding between the element 3 and the support 2 or to a partial delamination between the element 3 and the support 2, as this is illustrated on FIGS. 1B and 2B. In these figures, a zone 4 of the sample substrate 1 exhibits defective bonding between the element(s) 3 and the support 2. It has been observed by the applicant that a defective bonding may be revealed by the inclination of the outer surface of the element 3 with respect to its surroundings. Moreover, the applicant realized that this parameter appears to be very sensitive to any kind of defects at the origin of the defective bonding, such that a defective bond of the element 3 to the support can be detected surely by analyzing the inclination measurements of the exposed surface 1a of the sample substrate 1.

The present disclosure exploits this observation to propose an inspection method of a sample substrate 1 to identify an element or a plurality of elements whose inclination deviates from the inclination of the underlying support 2. Such a deviation is indicative of a defective bonding interface.

To this effect, and as this will be detailed in greater details in a next section of this description, the inspection method is using a measurement system MS configured to establish and exploit an inclination map of the exposed surface 1a of the sample substrate 1. Preferably, the measurement system can measure a quantity directly representative of the inclination, at a defined point of the exposed surface 1a. That is to say that the inclination is not reconstructed from an indirect measurement, such as by deriving the elevation of the exposed surface 1a.

Figure 3:
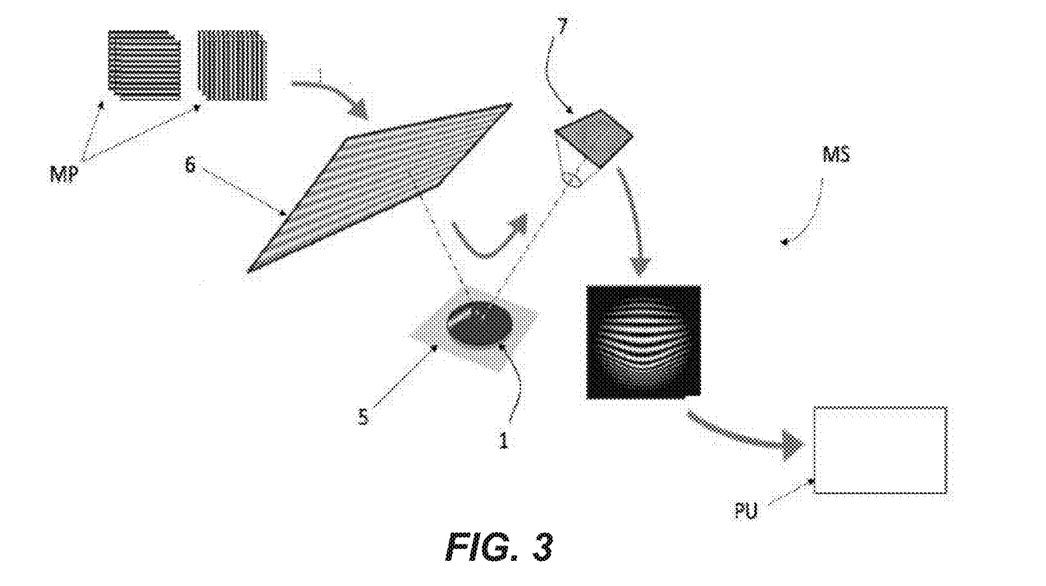
FIG. 3 represents a preferred embodiment of a measurement system allowing to implement an inspection method according to the present disclosure.

FIG. 3 represents a preferred embodiment of such a measurement system MS allowing implementation of an inspection method according to the present disclosure. The measurement system MS comprises a holder 5 for receiving the sample substrate 1. The measurement system MS also comprises a display screen 6, such as a thin film transistor (TFT) screen, configured to display a measurement pattern MP, such as a grid or stripes. The measurement pattern MP may be prepared and transmitted by a computing device connected to the screen 6. The screen 6 is positioned and oriented in the measurement system MS toward the sample substrate 1 such that the pattern may be reflected by the exposed surface 1a of the sample substrate 1. The measurement system MS also comprises a camera 7 disposed with respect to the display screen 6 and with respect to the sample substrate 1 to image the pattern reflected by the exposed surface 1a of the sample substrate 1. The measurement system MS also comprises a processing unit PU, connected to the camera 7, to receive and analyze the image produced by the camera 7 and produce the inclination map by deflectometry calculation. As this is well known, for instance, from U.S. Pat. No. 7,812,942, the processing unit PU may notably reconstruct the path of the light reflected by the exposed surface 1*a* and captured by the camera 7, to establish an inclination map. This approach is advantageous as it allows rapid production of the inclination map in one measurement step, without scanning the exposed surface 1*a* by a measurement spot or line. It is not excluded, however, for the deflectometry measurement system to be provided with means for scanning the exposed surface 1*a* of the sample substrate, as such scanning could still be useful, for example, if the measurement pattern reflected on the camera 7 does not extend completely across the exposed surface 1*a* of the sample substrate 1.

It is to be noted that after bonding the at least one element 3 to the support 2, the exposed surface 1*a* of the sample substrate is prepared, for instance, by polishing, and exhibit strong specular behavior. The exposed surface 1*a* is, therefore, particularly well suited for such a deflectometry technique. Indeed, when the exposed surface 1*a* is flat and specular, the light coming from the pattern displayed on the screen 6 is reflected by this exposed surface 1*a* with a similar reflection angle at all points. The camera 7 images the patterns displayed by the screen without distortion, to the exception of the distortions due to the geometry and the imaging path of the measurement system, which can be calibrated. In case of a local deformation or variation of slope on the exposed surface 1*a*, the light is reflected locally with a different angle, which results in the imaged pattern being distorted in comparison to the imaged pattern produced by a perfectly flat surface. That distortion, directly resulting from an angular deviation of the specular light due to the surface inclination, provides information on that inclination with a very high sensitivity. By preparing and displaying on the screen 6 successively several patterns of various orientation, period and/or spatial shift, it is possible to determine from the images produced by the camera 7, the local inclination at every point of the surface by which the pattern is imaged. The sensitivity and the resolution of the inclination measurement as measured by that technique can be made very high.

Figure 4:
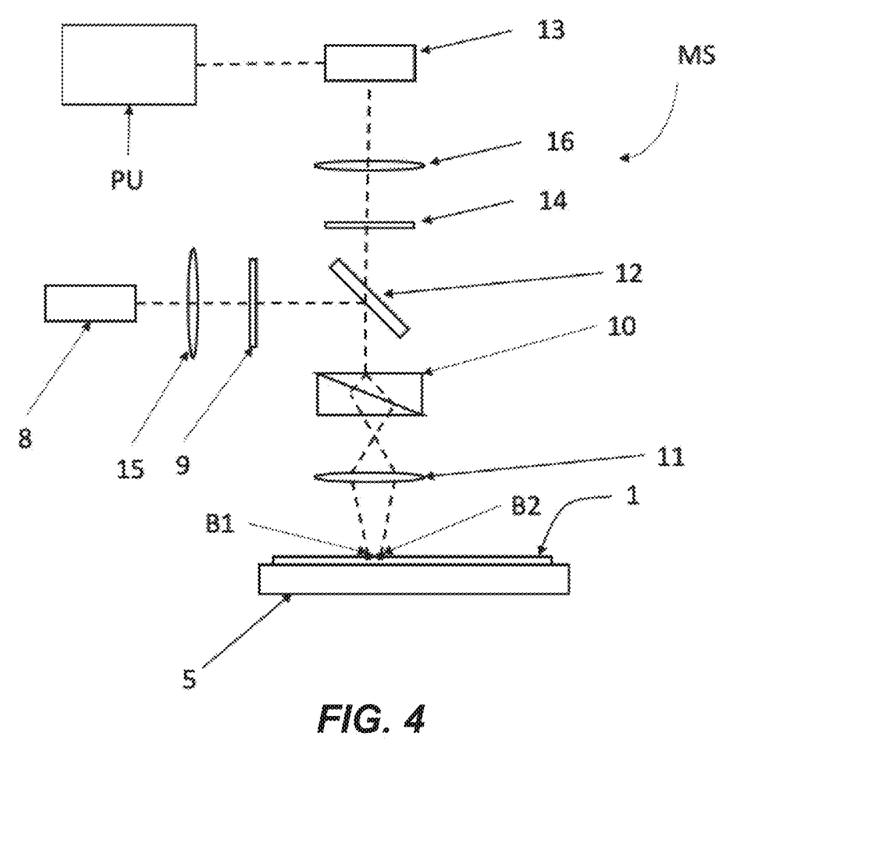
FIG. 4 represents another embodiment of a measurement system allowing to implement an inspection method according to the present disclosure.

Although the deflectometry measurement system MS of FIG. 3 represents the preferred measurement system for implementing the inspection method according to the disclosure, it is not forming the sole applicable measurement system. For instance, and in an alternative embodiment, the measurement system may implement an interferometric technique such as a Differential Interference Contrast (DIC) technique. In that case, as illustrated in FIG. 4, the measurement system MS may comprise an illumination device comprising a source 8 of coherent light, a polarizer 9 and a Nomarski or a Wollaston prism 10 to split the light of the source so as to form two inspection beams B1, B2 directed to the exposed surface 1*a* of the sample substrate 1, which is positioned on a substrate holder 5 of the system. The measurement system is arranged so that the two beams B1, B2 illuminate the exposed surface of the sample substrate in laterally shifted areas.

According to a well-known DIC technique, the spatial separation of the beams can be made, for instance, with an optical polarizer 9 polarizing the light of the source 8 so that it falls on the prism 10 with a linear polarization oriented at 45 degrees of the axis of the prism 10. The light is then separated in two beams of perpendicular polarization by the prism 10, which exit the prism 10 with respective propagation axis of different and crossing directions. These beams are then focused by a focusing lens 11 into two laterally shifted beams or spots B1, B2 on the exposed surface 1*a* of the sample substrate 1.

The light reflected by the surface travels back through the prism 10 and a beam splitter 12 toward a collector or a detector 13. An analyzer 14 is positioned on the path of the light toward the detector 13, together with a detector lens 16. The analyzer 14 forms a polarizer oriented perpendicularly to the orientation of the polarizer 9, with respect to the beam.

The light of the two beams B1, B2 falls on the exposed surface 1*a* at slightly shifted positions. A variation of height of the surface between these beams location results in an optical path difference between the two beams B1, B2. With the light traveling back through the prism 10, that optical path difference will result in light components of different polarization than the incident light. The analyzer 14 rejects all light components except those due to the optical path difference between the two beams B1, B2. These components are combined to interfere on the detector 13 and result in an intensity modulation representative of the optical path difference of the beams B1, B2. A processing unit PU of the measurement system is configured to analyze the resulting signal and deduce an optical path length difference between the two beams B1, B2. As these beams are projected on shifted areas on the exposed surface 1*a*, that optical path length difference is directly representative of the local inclination of the exposed surface 1*a* between the illuminated areas.

In the arrangement illustrated in FIG. 4, the light source 8, the spots B1, B2 and the detector 13 are optically conjugated by the source lens 15, the focusing lens 11 and the detector lens 16. The light source can be arranged to provide a point illumination, with two localized spots B1, B2 on the surface. The detector 13 can then be a point detector such as a photodiode. In such a case, the exposed surface may be scanned by the inspection light beams, for instance, by moving the sample substrate holder in x and y directions, to provide the inclination map.

The illumination device may be configured to provide an inspection field corresponding to a plurality of pairs of light beams, each pair illuminating an area of the exposed surface 1*a*, each resulting interference being detected by a separate detector, or pixels of a matrix or line detectors. In that case, the detector 13 may be a line or matrix camera. If the inspection field does not extend across the complete exposed surface 1*a*, scanning may be required.

The illumination device may also provide two strip-shaped illumination light beams parallel to each other that may be large enough to cover the dimension of the sample substrate along one main direction only (its diameter, for instance, if the sample substrate is disk shaped). The light source 8 can then be arranged to provide a line shaped or a strip shaped illumination. The detector 13 then may be a line detector, each pixel of which collecting the interference of the two light beams in an area corresponding to the projection of the pixel on the exposed surface 1*a* by the imaging system. In such circumstance, the preparation of the inclination map by the processing unit may require scanning the exposed surface 1*a* by the interfering inspection light fields along a single direction only, perpendicular to the main direction of extension of the inspection light beams. The operation can be repeated along two perpendicular directions on the sample substrate, to obtain an inclination map along all directions.

Whatever the measurement system chosen, and the inclination measurement technique deployed in the measurement system, the processing unit PU of this measurement system can produce an inclination map of the exposed surface 1a of the sample substrate, i.e., a plurality of local inclination measurements, each local inclination being associated to a defined position on the exposed surface 1a. The local inclination measurement may correspond to the angle existing between a direction normal or a direction tangential to the exposed surface at the defined position and a reference direction.

Figure 5:
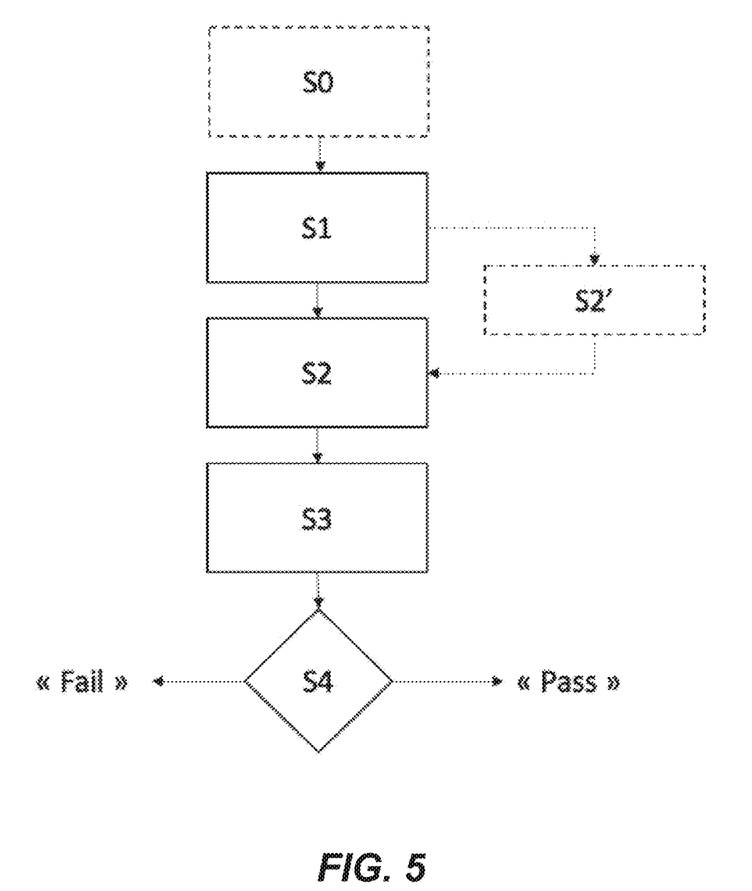
FIG. 5 schematically represents the sequence of steps of an inspection method according to the present disclosure.

With reference to FIG. 5, an inspection method for detecting a defective bonding interface 3b between an element 3 disposed on a support 2 of a sample substrate 1 comprises a providing step S1 of placing the sample substrate 1 in the measurement system. Typically, the sample substrate 1 is positioned on the holder 5 of the measurement system MS, manually or by an articulated arm, such that the exposed surface 1a of the sample substrate 1 is exposed for inspection. The sample substrate may be clamped to the holder, by electrostatic means or by suction, as known in the art.

In a following measuring step S2, an inclination map of the exposed surface 1a is established by the measurement system MS, as has been detailed in the preceding passages of this description. The inclination map is made of a plurality of local inclination measurements relative to a reference surface of the measurement system MS. The local inclination measurements, and preferably the complete inclination map, are prepared by the processing unit PU of the measurement system MS.

The raw local inclination measurements provided by the measurement system MS are relative to a reference surface, internal to the measurement system, that need to be properly defined. To conform to the principle of the present disclosure that is to identify elements 3 of the sample substrate whose inclinations deviate from the inclination of the underlying support 2, it is advantageous to define the reference surface as the main face 2a of the support 2.

To this effect, and according to one embodiment, the inspection method may comprise a calibration step S0 of the measurement system that is performed before the providing step S1 of placing the sample substrate 1 in the measurement system MS. The calibration step S0 comprises a first sub step of establishing an inclination map of the holder 5, and a second sub step of defining the reference surface as the inclination map of the holder. This approach assumes that the support 2 of the sample substrate 1 is flat and of very uniform thickness, such that the inclination map of the holder is representative of the inclination map of the main face 2a of the support 2. This approach is particularly relevant when the sample substrate 1 is maintained against the holder, by electrostatic means or by suction, for instance, so that any deformation of the sample substrate, bow or warp, is removed. In a variant, the calibration step S0 may comprise a first sub step of placing a dummy substrate, representative in shape of the support 2, on the holder 5 of the measurement system MS, a second sub step of establishing an inclination map of the dummy substrate, and a third sub step of defining the reference surface as the inclination map of the dummy substrate. This variant may not require clamping the sample substrate 1 on the holder 5.

Whatever the variant chosen, the inclination map provided in the subsequent measuring step S2 of the inspection method will be referenced to the main face 2a of the support 2.

Alternatively, or in addition to the calibration approach applied before the measuring step S2, the inspection method may comprise, after the measuring step S2, an offset step S2' of applying a transformation to the inclination map of the main face 1a of the sample substrate 1. This transformation is applying offset values of an offset map, by addition or subtraction, for instance, to the local raw inclination measurements provided by the measurement system MS at the measuring step S2.

The offset map may be stored in a library of the processing unit and be chosen in the library among a collection of offset maps to correspond to the support 2 of the sample substrate 1. In a variant, the offset map is established during the calibration step S0, from a dummy substrate, as this has been explained above.

In an implementation variant of the offset step S2', the offset map may be established by numerical processing of the inclination map of the main face 1a itself. For instance, this approach may comprise a first sub step of calculating a representative value of the raw local inclination measurements of the inclination map (for instance, a mean value, a median value or a mode value, i.e., the most frequent value, of the raw inclination measurements). The offset map is constructed from this representative value by setting each entry of the map to the representative value.

In another implementation variant of the offset step S2', the offset map is constructed by a first sub step of identifying, in the inclination map, local inclination measurements associated with the main surface 2a of the support 2. These local inclination measurements may correspond, for example, to portions of the main surface 2a visible between two juxtaposed elements 3, as it is illustrated in FIG. 1A, or on the annular portion of the front side 1a of the sample substrate 1, as it is illustrated on the FIG. 2A. The position of these local inclination measurements on the exposed surface 1a of the sample substrate 1 may be known in advance and thus can be selected in the inclination map among all the inclination measurements. This variant of the offset step S2' also comprises a second sub step of defining the offset map from the identified local inclination measurements. This second sub step may comprise interpolating the identified local inclination measurements to define each entry of the offset map.

When the inspection method involves a calibration step S0 and/or an offset step S2', an inclination map made of a plurality of local inclination measurements relative to a main surface 2a of the support 2 is available.

Referring again to FIG. 5 and to the general description of the inspection method, this method comprises, after the measuring step S2, an analyzing step S3. During the analyzing step S3, the inclination map is analyzed to identify a zone or a plurality of zones of the exposed surface 1a whose inclination deviates by more than a given threshold from the inclination of the reference surface, and advantageously from the inclination of the support 2. The zone or plurality of zones identified in the inclination map are referred to as "identified zones" in this description, for simplicity of expression. This step may be performed by the processing unit PU of the measurement system MS, or by a further processing unit, in connection with the measurement system MS.

Different approaches are possible to implement the analyzing step S3. In some instances, the analyzing step relies on a localization map defining the position and shape of a plurality of predefined zones on the exposed surface 1a of the sample substrate 1. The predefined zones may be defined by an arbitrary grid paving the exposed surface 1a with regular or irregular elementary surfaces. More advantageously, the predefined zones of the localization map correspond to the outer surfaces 3a of the elements 3 disposed on the support 2. In that case, predefined zone on the outer surface of the element 3 can be made to not encompass parts of the main surface 2a of the support 2. For instance, an image of the exposed surface may be provided and processed according to conventional computer vision technique to identify, in the image, the outer surfaces 3a on the support 2, and automatically construct the localization map. The image may be provided by a camera disposed in the measurement system MS, for instance, the camera 7 of the deflectometry system of FIG. 3.

In all cases, the analyzing step S3 comprises a first sub step of providing the localization map. Then, in a second sub step of the analyzing step S3 a representative value of the local inclination measurements associated with each predefined zone is calculated. The representative value may be selected in the group formed of a mean value, a median value, a mode value of the local inclination measurements associated with each predefined zone.

Consequently, for each zone, the inclination representative value is compared to a predetermined threshold. If the inclination representative value of a predefined zone is exceeding the threshold, it forms an identified zone, i.e., a zone comprising an element 3 that is defectively bonded to the support 2. The analyzing step S3 establishes and provides a list of such identified zone.

Finally, and following the analyzing step S3, the inspection method comprises a decision step S4 of detecting the presence of a defective bond between an element 3 and the support 2, depending on the result of the analyzing step S3. For instance, if the preceding analyzing step S3 fails to identify a predefined zone whose orientations deviate by more than the given threshold, a defective bond is not detected in the sample substrate 1, and the decision step S4 provides a "pass" signal or data, to indicate that the sample substrate is not defective. Conversely, and in the most simplified form of the decision step S4, if the analyzing step S3 provides at least one identified zone whose orientation deviates by more than the given threshold, then a defective bond is detected in the sample substrate 1, and the decision step provides a "fail" signal or data, to indicate that the sample substrate is defective.

The decision step may provide more information than the "pass or fail" signal. It may provide information (localization of the identified zones on the sample substrate or a sequence number allowing to localize the identified zone, representative inclination values of the predefined zones) relating to the identified zones. The decision step S4 may, for instance, provide an image of the exposed surface 1a of the sample substrate 1 where the identified zones are highlighted and/or the representative inclination values of the predefined zones are displayed, to further help in characterizing the sample substrate 1.

Other variations to the disclosed embodiment can be understood and effected by those skilled in the art in practicing the invention defined by the claims, from a study of the drawings, the disclosure, and the appended claims.

What is claimed is:

1. An inspection method for detecting a defective bonding interface in a sample substrate comprising at least one element disposed on a support, a bonding interface being defined between the at least one element and a main face of the support, an outer surface of the at least one element being exposed on a front side of the sample substrate and defining, at least in part, an exposed surface of the sample substrate, the inspection method comprising:
   placing the sample substrate in a measurement system;
   establishing, with the measurement system, an inclination map of the exposed surface, the inclination map comprising a plurality of local inclination measurements relative to a reference surface corresponding to the main face of the support;
   analyzing the inclination map, the analyzing comprising:
      calculating inclinations of predefined zones of the exposed surface, an inclination of a zone being a representative value of a local inclination measurement associated with the zone;
      identifying among the predefined zones at least one identified zone having an inclination deviating by more than a given threshold from the inclination of the reference surface; and
   detecting a presence of a defective bond between the at least one element and the support in the at least one identified zone.

2. The inspection method of claim 1, further comprising, before establishing the inclination map of the exposed surface, calibrating the measurement system by defining an inclination map of the main face of the support.

3. The inspection method of claim 2, wherein the measurement system comprises a holder for receiving the sample substrate during the establishing of the inclination map of the exposed surface, and the calibrating of the measurement system comprises establishing an inclination map of the holder, and then defining the reference surface as the inclination map of the holder.

4. The inspection method of claim 2, wherein the measurement system comprises a holder for receiving the sample substrate during the establishing of the inclination map of the exposed surface, and the calibrating of the measurement system comprises placing a dummy substrate on the holder, then establishing an inclination map of an exposed surface of the dummy substrate, and then defining the reference surface as the inclination map of the exposed surface of the dummy substrate.

5. The inspection method of claim 1, further comprising, after the establishing of the inclination map of the exposed surface, applying offset values of an offset map to the inclination map, and transforming the local inclination measurements of the inclination map to be relative to the main face of the support.

6. The inspection method of claim 5, wherein the applying of the offset map to the inclination map comprises calculating a representative value of the local inclination measurements of the inclination map established by the establishing of the inclination map of the exposed surface.

7. The inspection method of claim 5, wherein the applying of the offset map to the inclination map comprises:
   identifying, in the inclination map, local inclination measurements associated with the main face of the support; and
   then defining the offset map from the identified local inclination measurements.

8. The inspection method of claim 1, wherein the analyzing the inclination map further comprises:
   providing a localization map, the localization map defining a position of a plurality of predefined zones of the exposed surface of the sample substrate.

9. The inspection method of claim 8, wherein the localization map comprises at least one predefined zone corresponding to the outer surface of the at least one element.

10. The inspection method of claim 8, wherein the providing of the localization map comprises providing an image of the exposed surface of the sample substrate and applying a numerical processing to the image to identify the outer surface of the at least one element.

11. A measurement system for detecting a defective bonding interface in a sample substrate comprising at least one element disposed on a support, a bonding interface being defined between the at least one element and a main face of the support, an outer surface of the at least one element being exposed on a front side of the sample substrate and defining, at least in part, an exposed surface of the sample substrate, the measurement system comprising a holder for receiving the sample substrate and a processing unit configured for performing an inspection method comprising:

establishing an inclination map of the exposed surface, the inclination map being made of a plurality of local inclination measurements relative to a reference surface corresponding to the main face of the support;

analyzing the inclination map, the analyzing comprising:
calculating inclinations of predefined zones of the exposed surface, an inclination of a zone being a representative value of the local inclination measurements associated with the zone; and identifying among the predefined zones at least one identified zone having an inclination deviating by more than a given threshold from the inclination of the reference surface; and detecting a presence of a defective bond between the at least one element and the support in the at least one identified zone.

12. The measurement system of claim 11, further comprising:

an illumination device configured to provide two coherent light beams directed to the exposed surface of the sample substrate, the two coherent light beams illuminating the exposed surface of the sample substrate in shifted areas;

a detector configured to collect light of the two coherent light beams reflected by the exposed surface, the reflected light producing an interference signal on the detector; and the processing unit being further configured to analyze the interference signal and produce at least one local inclination measurement of the inclination map.

13. The measurement system of claim 12, further comprising a scanning unit configured to scan the exposed surface of the sample substrate so as to produce the inclination map.

14. The measurement system of claim 11, further comprising:

a display screen configured to display a measurement pattern;

a camera disposed in the measurement system and located with respect to the display screen and to the sample substrate so as to image the measurement pattern displayed by the display screen and reflected by the exposed surface of the sample substrate; and wherein the processing unit is further configured to analyze the image produced by the camera and produce at least a local inclination measurement of the inclination map.

15. The measurement system of claim 14, further comprising a scanning unit configured to scan the exposed surface of the sample substrate so as to produce the inclination map.

16. A method of inspecting and detecting a defective bonding interface in a sample substrate comprising at least one element disposed on a support, a bonding interface being defined between the at least one element and a main face of the support, an outer surface of the at least one element being exposed on a front side of the sample substrate and at least partially defining an exposed surface of the sample substrate, the method comprising:

placing the sample substrate in a measurement system;

using the measurement system to establish an inclination map of the exposed surface, the inclination map comprising a plurality of local inclination measurements relative to a reference surface corresponding to the main face of the support;

analyzing the inclination map including:
calculating inclinations of predefined zones of the exposed surface, an inclination of a zone being a representative value of the local inclination measurement associated with the zone; and identifying among the predefined zones at least one identified zone having an inclination deviating by more than a given threshold from an inclination of the reference surface, the at least one identified zone having a defective bond between the at least one element and the support.

* * * * *